United States Patent [19]
Park et al.

[11] Patent Number: 5,621,405
[45] Date of Patent: Apr. 15, 1997

[54] VARIABLE-LENGTH DECODING APPARATUS USING RELATIVE ADDRESS

[75] Inventors: Ju-ha Park, Suwon; Jechang Jeong, Seoul, both of Rep. of Korea

[73] Assignee: Samsung Electronics Co., Ltd., Kyungki-Do, Rep. of Korea

[21] Appl. No.: 543,038

[22] Filed: Oct. 13, 1995

[30] Foreign Application Priority Data

Oct. 17, 1994 [KR] Rep. of Korea .................. 94-26541

[51] Int. Cl.⁶ .......................... H03M 7/40; H03M 1/40
[52] U.S. Cl. ................................ 341/67; 358/427
[58] Field of Search .................. 341/67, 65, 63; 358/427; 395/427; 348/383

[56] References Cited

U.S. PATENT DOCUMENTS

| | | | |
|---|---|---|---|
| 5,369,405 | 11/1994 | Choi et al. | 341/63 |
| 5,379,116 | 1/1995 | Wada et al. | 358/431 |
| 5,432,512 | 7/1995 | Park | 341/67 |
| 5,459,482 | 10/1995 | Orlen | 345/98 |
| 5,475,389 | 12/1995 | Song et al. | 341/67 |
| 5,481,364 | 1/1996 | Ito | 358/261.1 |
| 5,512,896 | 4/1996 | Read et al. | 341/65 |
| 5,557,271 | 9/1996 | Rim et al. | 341/67 |
| 5,561,422 | 10/1996 | Kim | 341/67 |
| 5,561,690 | 10/1996 | Park | 375/340 |

*Primary Examiner*—Jeffrey A. Gaffin
*Assistant Examiner*—Peguy JeanPierre
*Attorney, Agent, or Firm*—Sughrue, Mion, Zinn, Macpeak & Seas

[57] ABSTRACT

A variable-length decoding apparatus outputs symbol data corresponding to variable-length data. The data may be presented in units of a block having a predetermined magnitude. The apparatus has a memory composed of a plurality of storage regions for outputting information. Each storage region is designated by an absolute address. Each storage region contains relative address data, symbol data and a status signal representing whether or not a symbol is determined and indicative of the class of the determined symbol. The apparatus also has an absolute address generator for generating absolute address data in response to a control signal and the relative address data supplied from the memory, as well as a controller for generating the control signal in response to a start signal indicative of a start of each block having a predetermined magnitude, and the status signal supplied from the memory. The controller may also form the control signal dependent upon the initial bit of variable-length-coded data in a block. Thus, the control circuit can be designed in hardware without using a barrel shifter, and a variable-length decoding table can be embodied by using a memory having a small capacity.

16 Claims, 5 Drawing Sheets

FIG.3B

| ABSOLUTE ADDRESS | RELATIVE ADDRESS | STATUS | | | RUN | LEVEL |
|---|---|---|---|---|---|---|
| | | LEAF | ESC | EOB | | |
| 0 | 4 | 0 | 0 | 0 | 0 | 0 |
| 1 | 2 | 0 | 0 | 0 | 0 | 0 |
| 2 | 0 | 1 | 0 | 0 | 0 | 1 |
| 3 (EOB) | 0 | 0 | 0 | 1 | 0 | 0 |
| 4 | 6 | 0 | 0 | 0 | 0 | 0 |
| 5 | 2 | 0 | 0 | 0 | 0 | 0 |
| 6 | 0 | 1 | 0 | 0 | 1 | 1 |
| 7 | 2 | 0 | 0 | 0 | 0 | 0 |
| 8 | 0 | 1 | 0 | 0 | 2 | 1 |
| 9 | 0 | 1 | 0 | 0 | 0 | 2 |
| 10 | 22 | 0 | 0 | 0 | 0 | 0 |
| 11 | 4 | 0 | 0 | 0 | 0 | 0 |
| 12 | 2 | 0 | 0 | 0 | 0 | 0 |
| 13 | 0 | 1 | 0 | 0 | 3 | 1 |
| 14 | 0 | 1 | 0 | 0 | 4 | 1 |
| 15 | 2 | 0 | 0 | 0 | 0 | 0 |
| 16 | 0 | 1 | 0 | 0 | 0 | 3 |
| 17 | 8 | 0 | 0 | 0 | 0 | 0 |
| 18 | 4 | 0 | 0 | 0 | 0 | 0 |
| 19 | 2 | 0 | 0 | 0 | 0 | 0 |
| 20 | 0 | 1 | 0 | 0 | 10 | 1 |
| 21 | 0 | 1 | 0 | 0 | 0 | 5 |
| 22 | 2 | 0 | 0 | 0 | 0 | 0 |
| 23 | 0 | 1 | 0 | 0 | 1 | 3 |
| 24 | 0 | 1 | 0 | 0 | 3 | 2 |
| 25 | 4 | 0 | 0 | 0 | 0 | 0 |
| 26 | 2 | 0 | 0 | 0 | 0 | 0 |
| 27 | 0 | 1 | 0 | 0 | 11 | 1 |
| 28 | 0 | 1 | 0 | 0 | 12 | 1 |
| 29 | 2 | 0 | 0 | 0 | 0 | 0 |
| 30 | 0 | 1 | 0 | 0 | 0 | 6 |

FIG.3B (CONTINUED)

| ABSOLUTE ADDRESS | RELATIVE ADDRESS | STATUS | | | RUN | LEVEL |
|---|---|---|---|---|---|---|
| | | LEAF | ESC | EOB | | |
| 31 | 0 | 1 | 0 | 0 | 13 | 1 |
| 32 | 8 | 0 | 0 | 0 | 0 | 0 |
| 33 | 4 | 0 | 0 | 0 | 0 | 0 |
| 34 | 2 | 0 | 0 | 0 | 0 | 0 |
| 35 | 0 | 1 | 0 | 0 | 5 | 1 |
| 36 | 0 | 1 | 0 | 0 | 1 | 2 |
| 37 | 2 | 0 | 0 | 0 | 0 | 0 |
| 38 | 0 | 1 | 0 | 0 | 6 | 1 |
| 39 | 0 | 1 | 0 | 0 | 7 | 1 |
| 40 | 8 | 0 | 0 | 0 | 0 | 0 |
| 41 | 4 | 0 | 0 | 0 | 0 | 0 |
| 42 | 2 | 0 | 0 | 0 | 0 | 0 |
| 43 | 0 | 1 | 0 | 0 | 8 | 1 |
| 44 | 0 | 1 | 0 | 0 | 0 | 4 |
| 45 | 2 | 0 | 0 | 0 | 0 | 0 |
| 46 | 0 | 1 | 0 | 0 | 9 | 1 |
| 47 | 0 | 1 | 0 | 0 | 2 | 2 |
| 48 | 2 | 0 | 0 | 0 | 0 | 0 |
| 49(ESC) | 0 | 0 | 1 | 0 | 0 | 0 |
| ⋮ | ⋮ | ⋮ | ⋮ | ⋮ | ⋮ | ⋮ |
| 224 | 0 | 1 | 0 | 0 | 1 | 18 |

VARIABLE-LENGTH DECODING APPARATUS USING RELATIVE ADDRESS

BACKGROUND OF THE INVENTION

The present invention relates to a variable-length decoding apparatus using relative address.

In a high-definition television (HDTV), a high-definition video tape recorder (HD-VTR), a digital VTR, a digital camcorder, a multimedia system, a video phone or a video conference system, both a video signal and an audio signal are converted into digital signals and the digitally converted signals are transmitted or stored in a recording medium, and then the transmitted or stored signals are decoded and reproduced. Such an encoding and decoding system requires a compression technology for compressing transmission data to maximize a data transmission efficiency. There are a transformation encoding method, a differential pulse code modulation (DPCM) method, a vector quantization method, a variable-length coding method as generally-used methods for encoding video signals. These encoding methods are used to reduce a total amount of data by removing redundancy data included in digital signals.

The variable-length coding method among the above encoding methods includes a run-length coding step and a (modified) Huffman coding step. In the run-length encoding step, the number of continuous zeros is represented as run-lengths to reduce the number of the samples. The run-length being the number of the continuous zeros generated in the run-length coding step and a magnitude or a level of n-zero sample correspond to a single codeword. For example, when certain data is input in sequence of "a, 0, 0, b, 0, 0, 0, 0, c, d, 0, e . . . " where a, b, c, d and e are not equal to zero, the run-length coded data is as follows: "[0, a], [2, b], [4, c], [0, d], [1, e], . . . ". Here, [0, a] represents that there is no zeros before the non-zero first level "a", and [2, b] represents that there are two zeros before the non-zero second level "b". As described above, the shorter-length codeword is assigned to the run-length coded symbol having the higher frequency of occurrence, and the longer-length codeword is assigned the run-length coded symbol having a lower frequency of occurrence, according to the Huffman code table. In case of symbols with extremely low frequency, the Huffman code table is not used. Instead, a fixed-length escape (ESC) code is used for performing a fixed-length coding operation. Then, since it is not proper to lengthen the run-length without limitation, a variable-length coding is performed in units of a certain block. A bitstream of the variable-length-coded data incluctes a code indicative of a start of a certain interval, a code indicative of an end of a certain interval, a code indicative of a video signal, a code indicative of an end-of-block (EOB), a variety of control codes, and a status inclication code.

FIG. 1 shows a conventional variable-length decoder for decoding variable-length-coded data. The FIG. 1 decoder is disclosed in more detail in a paper entitled "An Entropy Coding System For Digital HDTV Applications" (IEEE Transactions On Circuits And Systems For Video Technology, pp. 147–155, vol. 1. No. 1, March 1991, by Shaw-Min Lei and Ming-Ting Sun). Thus, an operation of the FIG. 1 apparatus will be simply described below.

In FIG. 1, the variable-length-coded data is transmitted in the form of a bitstream and is stored in a buffer (not shown) such as a first-in-first-out (FIFO) memory of a receiving end. The buffer outputs N-bit data to a first register 1 whenever a read signal is input thereto from a codeword length accumulator 5. First register 1 latches the N-bit variable-length-coded data output from the buffer whenever the read signal is input thereto from codeword length accumulator 5. A second register 2 latches the N-bit variable-length-coded data output from first register 1. A barrel shifter 3 receives the outputs of first and second registers 1 and 2, and outputs the received signals according to a length of the accumulated codeword output from codeword length accumulator 5. More specifically, barrel shifter 3 outputs the N-bit data stored in a window shifted by the codeword length accumulated in codeword length accumulator 5 to a programmable logic array (PLA) 4. PLA 4 decodes the N-bit variable-length-coded data output from barrel shifter 3, and outputs a codeword length being the number of the bits used for decoding, to codeword length accumulator 5. PLA 4 outputs a symbol for decoding and a codeword length of the symbol. Codeword length accumulator 5 adds the codeword length applied from PLA 4 to the stored accumulated codeword length, and produces a newly accumulated codeword length. Codeword length accumulator 5 generates a read signal if the newly produced accumulated codeword length is not less than N bits, and subtracts the number N of bits from the accumulated codeword length to calculate the accumulated codeword length to be supplied to barrel shifter 3. Codeword length accumulator 5 outputs, however, the accumulated codeword length to barrel shifter 3 if the accumulated codeword length is smaller than the N bits. Barrel shifter 3 outputs the data in a window shifted by the accumulated codeword length supplied from codeword length accumulator 5 among the 2N-bit data supplied from registers 1 and 2, to PLA 4. The detailed descriptions of the FIG. 1 apparatus including the operation of barrel shifter 3 are disclosed in the above Shaw-min Lei and Ming-Ting Sun's reference.

The above conventional variable-length decoding apparatus can decode one code every one clock pulse input. However, it was complicated to design the barrel shifter and the decoding control circuit. It required a large capacity of memory to use a ROM or a programmable logic array (PLA) for storing a variable-length decoding table. To use the barrel shifter, data which is input in the form of a bitstream should be changed in the form of parallel data.

SUMMARY OF THE INVENTION

Therefore, to solve the above problems, it is an object of the present invention to provide a variable-length decoding apparatus using relative address.

To accomplish the above object of the present invention, there is provided a variable-length decoding apparatus for outputting symbol data corresponding to variable-length-coded data, the variable-length decoding apparatus comprising:

memory means including a plurality of storage regions and for outputting information stored in a storage region designated by an absolute address data, wherein each storage region corresponds to the absolute address data and stores relative address data, a status signal representing whether or not a symbol is determined, and symbol data;

absolute address generation means for generating absolute address data in response to a control signal and the relative address data supplied from the memory means; and control means for generating the control signal in response to variable-length coded bit data and the status signal supplied from the memory means.

There is also provided a variable-length decoding apparatus for outputting symbol data corresponding to variable-length-coded data in units of a block having a predetermined magnitude, the variable-length decoding apparatus comprising:

memory means including a plurality of storage regions and for outputting information stored in a storage region designated by an input absolute address data, wherein each storage region corresponds to the absolute address data and stores relative address data, symbol data and a status signal representing whether or not a symbol is determined and indicative of the class of the determined symbol;

absolute address generation means for generating absolute address data in response to a control signal and the relative address data supplied from the memory means; and control means for generating the control signal in response to a start signal indicative of a start of each block having a predetermined magnitude, variable-length coded bit data and the status signal supplied from the memory means.

BRIEF DESCRIPTION OF THE DRAWINGS

The preferred embodiments are described with reference to the drawings wherein:

FIGS. 3A through 3B are diagrams for explaining the memory 21A which is designed on the basis of the variable-length-coding table for an inter-mode.

DETAILED DESCRIPTION OF THE PREFERRED EMBODIMENT

A preferred embodiment of the present invention will be described below in more detail with reference to the accompanying drawings FIGS. 2, 3A and 3B.

Figure 1:
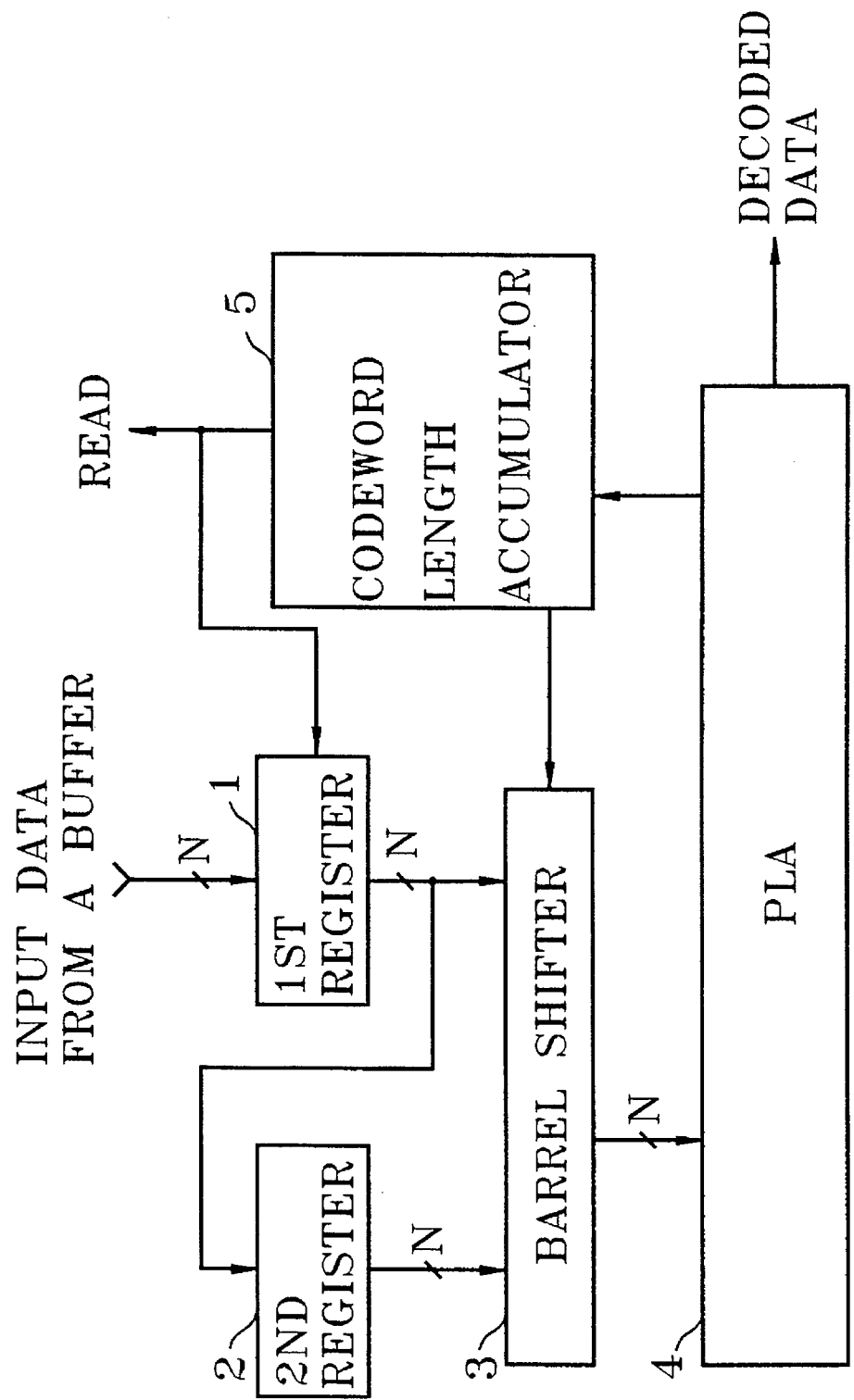
FIG. 1 is a block diagram of a conventional variable-length decoding apparatus.
Figure 2:
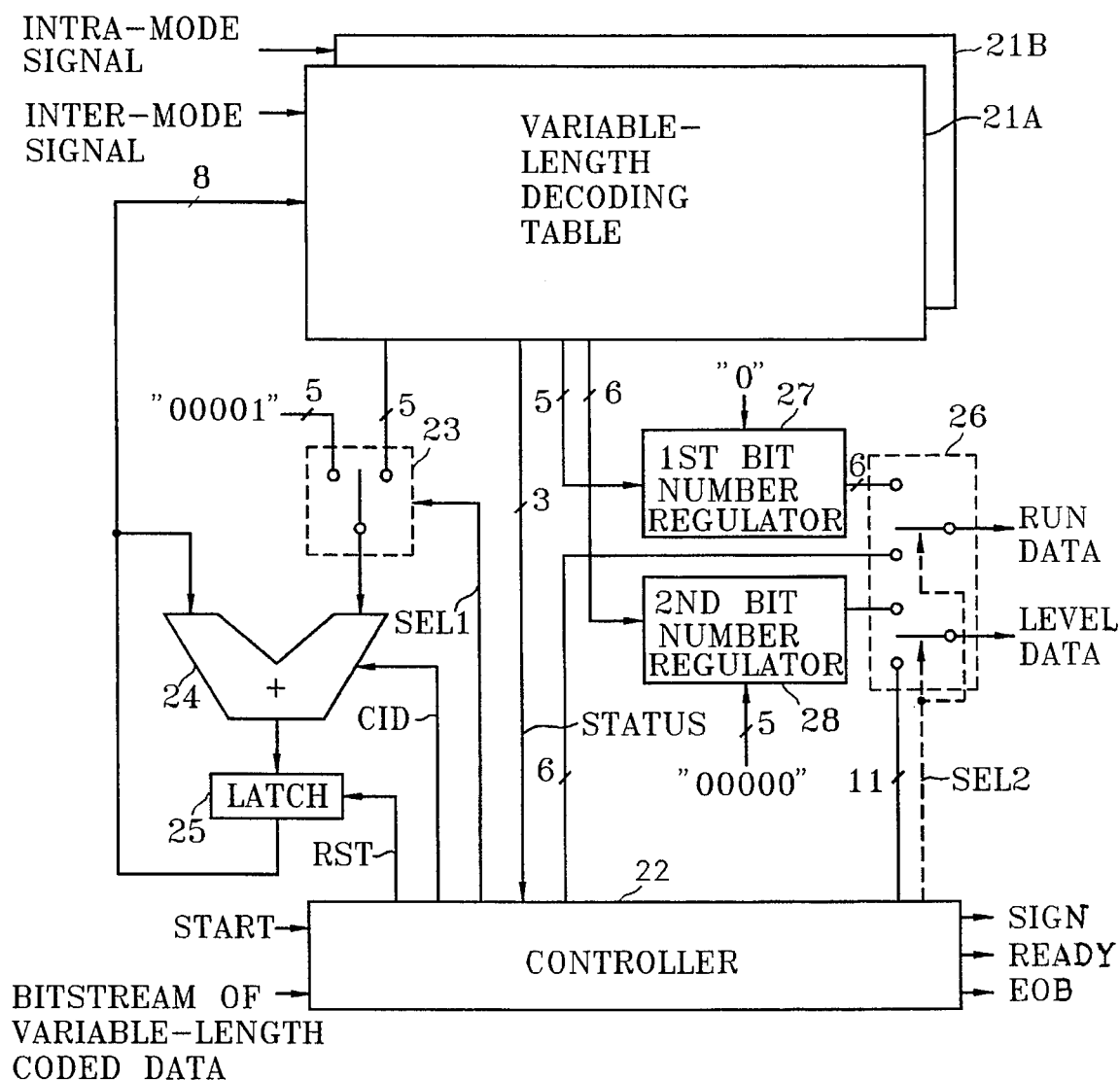
FIG. 2 is a block diagram of a variable-length decoding apparatus using relative address according to a preferred embodiment of the present invention.

FIG. 2 shows a schematic block diagram of a variable-length-decoding apparatus according to a preferred embodiment of the present invention.

The FIG. 2 apparatus includes two memories 21A and 21B for an inter-mode and an intra-mode, respectively. The memories 21A and 21B are activated by an inter-mode signal INTER and an intra-mode signal INTRA which are respectively input from an external source. The memory 21A or 21B stores relationships between a variable-length code and a symbol according to a variable-length coding table in a plurality of absolute address values, respectively in the form where relative address data, a status signal representing whether a symbol is determined and symbol data are assigned therein. Memory 21A or 21B has relative address data for absolute address data corresponding to a symbol determined by a value among the values which are possessed by the following input variable-length-coded bit data. The detailed description of memory 21A or 21B will follow with reference to FIGS. 3A and 3B. The FIG. 2 apparatus includes a controller 22 for controlling a variable-length-decoding operation using memories 21A and 21B. Controller 22 receives a start signal START representing a start of a certain interval such as a macroblock or a block, and variable-length-coded bit data received in the form of a bitstream, and generates control signals (RST, CID, SEL1, SEL2, SIGN, READY and EOB). A first selector 23 outputs one of a predetermined address value "$00001_2$" and relative address data RADDR output from memory 21A or 21B, to an adder 24 according to a first select signal SEL1 generated by controller 22. Adder 24 adds the output data of latch 25, identification bit data CID output from controller 22, and the output data of first selector 23. Absolute address data AADDR produced by adder 24 is stored in latch 25. The data stored in latch 25 is used as an absolute address for memory 21A or 21B. A first bit number regulator 27 regulates 5-bit run data applied from memory 21A or 21B into 6-bit data, and a second bit number regulator 28 regulates 6-bit run data applied from memory 21A or 21B into 11-bit data. A second selector 26 selectively outputs the data output from bit number regulators 27, 28 and controller 22 according to a second select signal SEL2 supplied from controller 22. Controller 22 includes a 6-bit data transmission line and a 11-bit data transmission line, which are connected to second selector 26, respectively.

Prior to describing the operation of the FIG. 2 apparatus having the above structure, a structure of memory 21A or 21B will be described in detail with reference to FIGS. 3A and 3B.

Figure 3A:
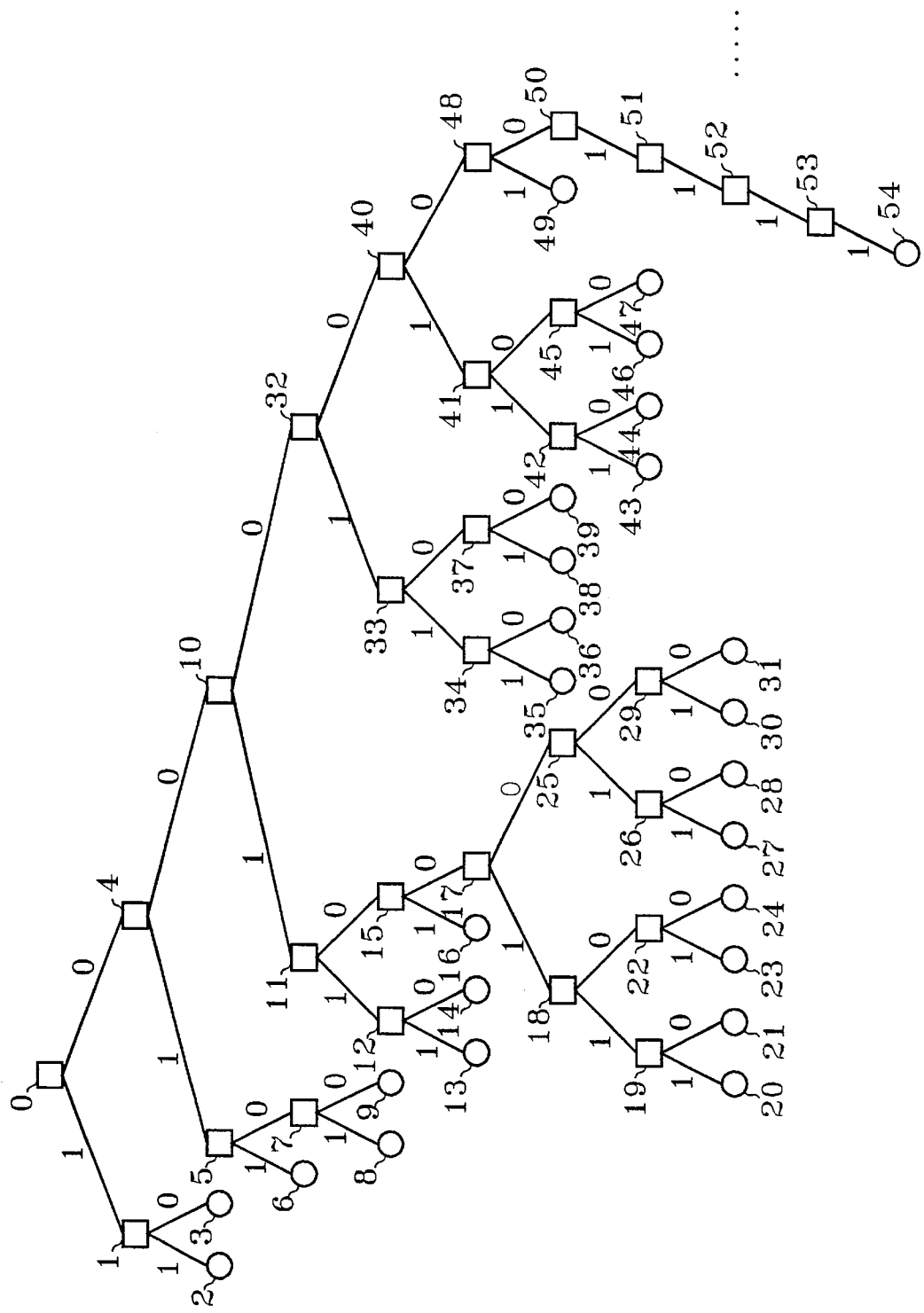

The Huffman tree shown in FIG. 3A has absolute addresses corresponding to the number of nodes which are shown by boxes and circles, and has run/level data corresponding to the number of leaves which are shown by the circles. The total number of the nodes of the Huffman tree shown in FIG. 3A is calculated by the following equation (1).

$$\text{Total number of nodes} = [\text{the number of leaves} \times 2] - 1 \quad (1)$$

When the Huffman tree of FIG. 3A is constructed according to discrete cosine transform DCT coefficients of the Moving Pictures Experts Group II (MPEG2), since the number of the leaves is 113, the total number of the nodes are 225 (=[2×113]−1). Memory 21A or 21B designed on the basis of the Huffman tree has 225 absolute addresses. Here, each absolute address is assigned to each storage region having a 19-bit storage capacity. The 19-bit information stored in each storage region is formed of 5-bit relative address data, a 3-bit status signal, 5-bit run data and 6-bit level data. Here, the relative address is for designating the following node and the status signal STATUS represents which one an input code is among an ESC code, an EOB code or run/level data. Each memory 21A or 21B is designed to have the minimum data capacity which can identify symbols in the variable-length-coding table. Thus, memory 21A or 21B needs 225 nodes and is accordingly designed to have the data storage capacity of the total 4275 bits. When FIG. 3A shows the Huffman tree for the DCT coefficients of an inter-mode of MPEG2, memory 21A has a relationship between an absolute address and a symbol as shown in FIG. 3B. In this case, a relative address, a leaf, an ESC code and an EOB code are also shown in FIG. 3B. Since it is apparent to a person having an ordinary skill in the art to design memory 21B for an intra-mode of MPEG2 on the basis of the above-described contents and FIGS. 3A and 3B, the detailed descriptions will be omitted.

Returning to the FIG. 2 apparatus, the FIG. 2 apparatus performs a corresponding operation whenever each bit data of the variable-length-coded data input in the form of the bit stream is input thereto. If the FIG. 2 apparatus starts to perform a variable-length-decoding operation, memory 21A or 21B is activated by a mode signal INTRA or INTER which is input to a corresponding table. The/node signal INTRA or INTER is also input to controller 22. When a signal START representing a start of a macroblock or block unit according to the MPEG2 is applied thereto, controller 22 judges whether an inter-mode signal INTER is applied or not. That is, controller 22 judges whether a variable-length-decoding operation is performed using memory 21A for an inter-mode. When the variable-length-decoding operation is performed in the inter-mode, controller 22 generates identification data CID having different values according to a value of the bit data which is initially input after start signal START is applied. If the initial bit data value is "1," controller 22 outputs identification bit data CID having a value of "1" to adder 24. On the other hand, when the variable-length-decoding operation is performed in an intra-mode, controller 22 generates identification bit data CID having a constant value "0" independently of a bit data value which is initially input after start signal START is applied. Also, controller 22 generates identification bit data CID having a constant value "0" independently of a bit data value which is input after the initial bit data is applied. Therefore, except for a case generating identification bit data CID, the FIG. 2 apparatus uses memory 21A or 21B according to each mode, and operates in the same way independently of the intra-mode and the inter-mode. For this reason, only the FIG. 2 apparatus which operates in an inter-mode will be described in more detail with reference to FIGS. 3A and 3B.

When start signal START is applied, controller 22 generates a reset signal RST and makes the data stored in latch 25 into null data. Controller 22 generates first select signal SEL1 according to a value of the bit data input. Thus, when a value of the variable-length-coded bit data input to controller 22 is "1," first selector 23 outputs a predetermined address value "00001$_2$" to adder 24 according to first select signal SEL1. Meanwhile, when a value of the variable-length-coded bit data input to controller 22 is "0," first selector 23 outputs relative address data RADDR output from memory 21A or 2B to adder 24 according to first select signal SEL1.

When a value of the variable-length-coded bit data which is initially input to controller 22 after start signal is applied, is "1," adder 24 adds addition address data "00001$_2$" supplied from first selector 23 and identification bit data CID having a value "1" and generates absolute address data AADDR of which the value is "2." Absolute address data AADDR is stored in latch 25 and supplied to memory 21A. Memory 21A outputs relative address data RADDR, status signal STATUS and run/level data which are stored in the storage region having an absolute address value "2." In FIG. 3B, when the absolute address value is "2," run data is "0" and level data is "1." Thus, memory 21A outputs status signal STATUS of which the leaf bit value is "1" to controller 22, and outputs run/level data (=0/1) to first bit number regulator 27 and second bit number regulator 28. In this case, memory 21A also moves a pointer so that an absolute address having data "0" is pointed out. Controller 22 generates a reset signal RST according to status signal STATUS and latch 25 is initialized by reset signal RST. Since the leaf bit value of the applied status signal STATUS is "1," controller 22 judges that the run/level data is determined with respect to the input bit data, and outputs the following input variable-length-coded bit data as a sign signal SIGN. Here, sign signal SIGN is added in the rear end of the codewords used for a variable-length-coding operation, according to the MPEG2 standard. When the first bit data is "1" after start signal START is applied, controller 22 resumes a variable-length-coding operation for determining a symbol from a newly input bit data next to 2-bit data including the first bit data.

On the other hand, when the firstly input variable-length-coded bit data after start signal START is applied is "0," since relative address data RADDR output from memory 21A, absolute address data AADDR and identification bit data CID output from controller 22 are all "0," adder 24 generates absolute address data AADDR of which the value is "0." Memory 21A outputs relative address data RADDR of "4" corresponding to absolute address data AADDR of "0" to first selector 23, and outputs status signal STATUS of which the 3-bit data are all "0" to controller 22. If the variable-length-coded bit data is newly applied to controller 22, controller 22 outputs identification bit data CID of which the value is "0" to adder 24 and generates first select signal SEL1 having the same value as the newly input bit data. Adder 24 adds the data latched in latch 25, identification bit data CID supplied from controller 22 and the data output from first selector 23, and supplies the absolute address data AADDR obtained by an addition operation to latch 25. Absolute address data AADDR stored in latch 25 is supplied to memory 21A or 21B and is used as an absolute address of memory 21A or 21B. Memory 21A or 21B moves a pointer according to 8-bit absolute address data AADDR supplied from latch 25, and outputs relative address data RADDR, status signal STATUS and run/level data which are stored in the storage region which is designated by a corresponding absolute address.

When a particular symbol is not determined with respect to the variable-length-coded bit data which is input to controller 22, memory 21A generates relative address data RADDR stored in the storage region which is designated by absolute address data AADDR applied from latch 25, and status signal STATUS of which the 3-bit data has a value of "0." If a particular run/level data is determined, memory 21A outputs corresponding run data and level data to first bit number regulator 27 and second bit number regulator 28, respectively. and outputs status signal STATUS of which the value of the leaf bit is "1" to controller 22. Controller 22 generates a second select signal SEL2 which makes the data outline from bit number regulators 27 and 28 output via second selector 26 according to status signal STATUS. First bit number regulator 27 adds "0" to the 5-bit run data applied from memory 21A or 21B to make 6-bit data, and then the added result to second selector 26. Second bit number regulator 28 adds "00000" to the 6-bit level data applied from memory 21A or 21B to make 11-bit data, and then the added result to second selector 26. Bit number regulators 27 and 28 follow the MPEG2 standard to make the input 5-bit run data into 6-bit length and the input 6-bit level data into 11-bit length.

For assisting the understanding of the determination of the particular run/level data, a case where the bit data is input to controller 22 in sequence of "011s" at the time of completion of a decoding operation with respect to the previous symbol, will be described below.

If the decoding operation is completed with respect to the previous symbol, controller 22 generates reset signal RST and resets latch 25. If the bit data of "0" is applied to controller 22, controller 22 generates identification bit data CID of which the value is "0" and first select signal SEL1 which makes relative address signal RADDR applied from memory 21A go to adder 24. Adder 24 adds the output data, "0" of latch 25, identification bit data CID and the output data of first selector 23, and generates absolute address data AADDR of which the value is "0." Latch 25 stores absolute address data AADDR and memory 21A moves a pointer so that the storage region of which the absolute address data is "0" in FIG. 3A is pointed out according to absolute address data AADDR stored in latch 25. Controller 22 generates first select signal SEL1 which makes second selector 23 output addition address data "$00001_2$" and identification bit data CID of which the value is "0" with respect to the second bit data "1." Adder 24 performs an addition operation with respect to the input data and outputs absolute address data AADDR, "5" resulting from the addition operation to latch 25. Latch 25 stores absolute address data AADDR, that is, "5." Memory 21A moves a pointer so that a storage region having absolute address data AADDR, "5" is pointed out, and outputs relative address data RADDR stored in the storage region, that is, "2" to first selector 23. With respect to the third bit data "1," first selector 23 outputs added address data "$00001_2$" to adder 24 and adder 24 adds the data "5" stored in latch 25, the output data "$00001_2$" of first selector 23 and identification bit data CID of which the value is "0" under control of controller 22. The data "6" which is produced by adder 24 is stored in latch 25. Memory 21A moves a pointer so that a storage region having absolute address data AADDR, "6" stored in latch 25 is pointed out. Memory 21A outputs run data "1" and level data "1" stored in the storage region designated by the pointer to first bit number regulator 27 and second bit number regulator 28, respectively. Since status signal STATUS output from memory 21A has the leaf bit value "1," controller 22 generates second select signal SEL2 which makes the data supplied from bit number regulators 27 and 28 output via second selector 26. Controller 22 outputs a sign signal SIGN having the same value as the next input bit data. Controller 22 also generates a reset signal RST for resetting latch 25. Such a reset signal RST is generated in the case when a particular symbol is determined from the variable-length-coded data input to controller 22, that is, the run/level data, the EOB code or the ESC code is determined by the input variable-length-coded data.

When the variable-length-coded bit data input to controller 22 is an EOB code, memory 21A or 21B generates status signal STATUS of which the EOB bit value is "1" and controller 22 generates an EOB signal according to status signal STATUS. When the variable-length-coded bit data input to controller 22 is an ESC code, memory 21A or 21B generates status signal STATUS of which the ESC bit value is "1." If status signal STATUS is applied, controller 22 outputs the stored fixed-length ESC code data to second selector 26, and generates second select signal SEL2 which makes the ESC code data output via from second selector 26. The run/level data output from second selector 26 and the ESC code data are supplied to an inverse quantizer (not shown). A ready signal READY output from controller 22 is for informing rear blocks (not shown) that the signals output from second selector 26 or controller 22 are effective signals. The ready signal READY is generated when the run/level data or the ESC code data is output from second selector 26, or when the sign signal SIGN or the EOB code data is output from controller 22.

In the above-described embodiment, the variable-length-decoding apparatus operates according to start signal START representing a start of a certain interval such as a macroblock or a block, and is constructed so that controller 22 generates the ESC code data and the EOB signal. However, it is apparent to one skilled in the art that a modified embodiment is possible in which memory 21A or 21B generates the EOB signal and the ESC code data. In this modified embodiment, a status signal represents whether or not only a symbol is determined.

As described above, the variable-length decoding apparatus using relative address according to the present invention performs a processing procedure different from that of a conventional variable-length-decoding system using a barrel shifter. Accordingly, a simpler control circuit is used compared with the conventional system, to then be designed in a small amount of hardware. Also, the variable-length-coding table can be embodied using a small capacity of memories.

What is claimed is:

1. A variable-length decoding apparatus for outputting symbol data corresponding to received variable-length-coded data, the variable-length decoding apparatus comprising:

memory means including a plurality of storage regions and for outputting information stored in one of said storage regions designated by an absolute address data, wherein each said storage corresponds to an absolute address and stores relative address data, a status signal representing whether or not a symbol is determined, and symbol data;

absolute address generation means for generating said absolute address data in response to a control signal and a relative address data supplied from one of said storage regions of said memory means; and control means for generating said control signal in response to a bit of the received variable-length coded data and a status signal supplied from said memory means.

2. The variable-length decoding apparatus according to claim 1, wherein said memory means stores relationships between a variable-length code and a symbol according to a variable-length coding table at a plurality of absolute address values, respectively in the form where relative address data, a status signal representing whether a symbol is determined and symbol data are assigned therein; and wherein said relative address data is for absolute address data corresponding to a symbol determined by one value among values which are possessed by a following bit of the input variable-length-coded data.

3. The variable-length decoding apparatus according to claim 2, wherein said each storage region stores relative address data, a status signal and symbol data corresponding to each of the absolute address values, in the minimum data magnitude which can identify the relative address data, the status signal and the symbol data corresponding to a different absolute address value.

4. The variable-length decoding apparatus according to claim 1, wherein each of said plurality of the storage regions provided in said memory means is one of a first type storage region storing symbol data corresponding to the variable-length-coded data and a status signal representing that a symbol is, and a second type storage region storing relative address data when there is no symbol data corresponding to the variable-length-coded data and a status signal representing that a symbol is not determined.

5. The variable-length decoding apparatus according to claim 4, wherein said memory means outputs a status signal representing that a particular symbol is determined and symbol data, if a first type storage region is designated by the absolute address data generated by said absolute address generation means, and outputs a status signal representing that a particular symbol is not determined and relative address data, if a second type storage region is designated by the absolute address data generated by said absolute address generation means.

6. The variable-length decoding apparatus according to claim 1, wherein said absolute address generation means comprises:

a latch for storing input data;

a selector for selectively outputting the relative address data output from said memory means and a predetermined address value according to a select control signal; and an adder for adding the data stored in said latch and the data applied from said selector to produce absolute address data, and supplying the produced absolute address data to said latch, and wherein said control means resets said latch if a status signal representing that the symbol corresponding to the variable-length-coded data is applied from said memory means and generates the select control signal according to a value of a currently input bit of the variable-length-coded data.

7. The variable-length decoding apparatus according to claim 6, wherein said control means generates a select control signal which makes said predetermined address value be outputted to said adder if a value of the currently input bit of the variable-length-coded data is "1", and generates a select control signal which makes the relative address data supplied form said memory means be outputted to said adder if the value of the currently input bit of the variable-length-coded data is "0".

8. A variable-length decoding apparatus for outputting symbol data corresponding to received variable-length-coded data in units of a block having a predetermined magnitude, said variable-length decoding apparatus comprising:

memory means including a plurality of storage regions and for outputting information stored in one of said storage regions designated by an input absolute address data, wherein each said storage region corresponds to an absolute address and stores relative address data, symbol data and a status signal representing whether or not a symbol is determined and indicative of the class of the determined symbol;

absolute address generation means for generating said input absolute address data in response to a control signal and a relative address data supplied from said memory means; and control means for generating said control signal in response to a start signal indicative of a start of a block of received variable-length-coded data, a bit of the received variable-length coded data and a status signal supplied from said memory means.

9. The variable-length decoding apparatus according to claim 8, wherein said memory means stores relationships between a variable-length code and a symbol according to a variable-length coding table in a plurality of absolute address values, respectively in the form where relative address data, a status signal representing whether a symbol is determined and symbol data are assigned therein; and wherein said relative address data is for absolute address data corresponding to a symbol determined by one value among values which are possessed by a following bit of the input variable-length-coded data.

10. The variable-length decoding apparatus according to claim 9, wherein said memory means stores relative address data, a status signal and symbol data corresponding to each absolute address value, in the minimum data magnitude which can identify the relative address data, the status signal and the symbol data corresponding to a different absolute address value.

11. The variable-length decoding apparatus according to claim 10, further comprising bit number regulation means for regulating a bit number so that the symbol data output from said memory means matches a data format according to a signal standard using said variable-length-coding table.

12. The variable-length decoding apparatus according to claim 9, wherein each of said plurality of the storage regions provided in said memory means is one of a first type storage region storing symbol data corresponding to the variable-length-coded data and a status signal representing that a symbol is determined, and a second type storage region storing relative address data when there is no symbol data corresponding to the variable-length-coded data and a status signal representing that a symbol is not determined.

13. The variable-length decoding apparatus according to claim 8, wherein said absolute address generation means comprises:

a latch for storing input data;

a selector for selectively outputting the relative address data output from said memory and a predetermined address value according to a select control signal; and an adder for adding the data stored in said latch and the data applied from said selector to produce absolute address data, and supplying the produced absolute address data to said latch, and wherein said control means resets said latch if a status signal representing that the symbol corresponding to the variable-length-coded data is applied from said memory means and generates the select control signal according to a value of a currently input bit of the variable-length-coded data, in which a value of the data applied to said adder is determined according to a value of a bit of the variable-length-coded data which is initially input after said start signal has been input.

14. The variable-length decoding apparatus according to claim 13, wherein said control means generates a select control signal which makes said predetermined address value be outputted to said adder if a value of the currently input bit of the variable-length-coded data is "1", and generates a select control signal which makes the relative address data supplied from said memory means be outputted to said adder if the value of the currently input bit of the variable-length-coded data is "0".

15. The variable-length decoding apparatus according to claim 13, wherein when said memory means is constructed on the basis of the variable-length-coding table for the discrete cosine transform coefficients of the MPEG2 standard, said control means controls said adder to produce an addition resultant value obtained by adding a value "1" to the output data of said selector and the output data of said latch, if a value of the initially input bit of the variable-length-coded data after the start signal has been applied is "1."

16. The variable-length decoding apparatus according to claim 8, wherein said control means outputs an end-of-block code which has been stored if a status signal indicative of a predetermined end-of-block is applied from said memory means.

* * * * *